United States Patent
King

(10) Patent No.: US 9,559,706 B1
(45) Date of Patent: Jan. 31, 2017

(54) TECHNIQUES FOR PHASE SHIFTING PERIODIC SIGNALS

(75) Inventor: Wilfred Wee Kee King, Kuching (MY)

(73) Assignee: Altera Corporation, San Jose, CA (US)

( * ) Notice: Subject to any disclaimer, the term of this patent is extended or adjusted under 35 U.S.C. 154(b) by 978 days.

(21) Appl. No.: 12/830,631

(22) Filed: Jul. 6, 2010

(51) Int. Cl.
  *H03H 11/16* (2006.01)
  *H03K 5/13* (2014.01)
  *H03L 7/081* (2006.01)
  *H03K 5/00* (2006.01)

(52) U.S. Cl.
  CPC ............... *H03L 7/0812* (2013.01); *H03K 5/13* (2013.01); *H03L 7/0814* (2013.01); *H03K 2005/00286* (2013.01)

(58) Field of Classification Search
  CPC ............ H03K 5/13; H03K 2005/00052; H03K 2005/00286; H03L 7/0812; H03L 7/0814
  USPC ................... 327/231, 237, 241, 242
  See application file for complete search history.

(56) References Cited

U.S. PATENT DOCUMENTS

| | | | | |
|---|---|---|---|---|
| 5,900,779 A | * | 5/1999 | Giacomini | 330/252 |
| 6,111,445 A | | 8/2000 | Zerbe et al. | |
| 6,639,472 B2 | * | 10/2003 | Wilson et al. | 330/308 |
| 7,135,905 B2 | | 11/2006 | Teo et al. | |
| 7,180,352 B2 | * | 2/2007 | Mooney et al. | 327/237 |
| 7,308,065 B2 | * | 12/2007 | Donnelly et al. | 375/373 |
| 7,409,012 B2 | | 8/2008 | Martin et al. | |
| 7,532,053 B2 | | 5/2009 | Rausch | |

OTHER PUBLICATIONS

Muneo Fukaishi, et al., "A 20-Gb/s CMOS Multichannel Transmitter and Receiver Chip Set for Ultra-High-Resolution Digital Displays," IEEE Journal of Solid-State Circuits, vol. 35, No. 11, Nov. 2000, pp. 1611-1618.

Rainer Kreienkamp, et al., "A 10-Gb/s CMOS Clock and Data Recovery Circuit With an Analog Phase Interpolator," IEEE Journal of Solid-State Circuits, vol. 40, No. 3, Mar. 2005, pp. 736-743.

Stefanos Sidiropoulos, et al., "A Semidigital Dual Delay-Locked Loop," IEEE Journal of Solid-State Circuits, vol. 32, No. 11, Nov. 1997, pp. 1683-1692.

Kostas Pagiamtzis, "ECE1352 Analog Integrated Circuits Reading Assignment: Phase Interpolating Circuits," Nov. 12, 2001, pp. 1-19.

* cited by examiner

*Primary Examiner* — Lincoln Donovan
*Assistant Examiner* — Colleen O Toole
(74) *Attorney, Agent, or Firm* — Steven J. Cahill

(57) ABSTRACT

A phase interpolator circuit includes differential pairs of transistors, current source circuits, and a transimpedance amplifier circuit. Each of the current source circuits is coupled to provide current through one of the differential pairs of transistors. The transimpedance amplifier circuit converts the current through the differential pairs of transistors into a voltage signal.

22 Claims, 11 Drawing Sheets

TECHNIQUES FOR PHASE SHIFTING PERIODIC SIGNALS

BACKGROUND

The present invention relates to electronic circuits, and more particularly, to techniques for phase shifting periodic signals.

A digital periodic clock signal is often used to sample a data signal that is transmitted to an integrated circuit from an external source. Different techniques can be used to align the rising and falling edges of the clock signal with respect to a sampling window of the data signal so that the data signal can be sampled accurately. As the clock signal frequency and the data rate increases, the sampling window decreases, and the sampling timing is more constrained. A phase interpolator circuit is an example of a circuit that can be used to generate a desired phase shift in a high frequency sampling clock signal.

FIG. 1A illustrates a prior art phase shifting system. The system of FIG. 1A includes a control circuit 10, a multiplexer block 15, slew rate circuits 21-24, and analog phase interpolator 30. FIG. 1B illustrates details of analog phase interpolator 30. Phase interpolator (API) 30. Phase interpolator 30 includes two differential pairs formed by n-channel metal oxide semiconductor field-effect transistors (MOSFETs) 41-44, variable current sources 51-52, resistors 61-62, and voltage comparator 71.

A phase interpolator circuit can generate any one of a number of different phases in a periodic output signal relative to the phases of periodic input signals. A phase interpolator circuit can generate a sinusoidal output voltage signal $V_{OUT}$ that is a weighted sum of two sinusoidal voltage input signals, as shown in equations (1)-(3).

$$V_{OUT}=R\times[(\alpha\times\sin(\omega t))+(\beta\times\cos(\omega t))]=C\times\sin(\omega t+\theta) \quad (1)$$

$$C = R \times \sqrt{\alpha^2 + \beta^2} \quad (2)$$

$$\theta=\text{Arctan}(\beta/\alpha) \quad (3)$$

In equations (1) and (2), R is the resistance of resistor 61, R is also the resistance of resistor 62, $\alpha$ and $\beta$ are the currents through current sources 51-52, respectively, and w is the angular frequency of the periodic input signals of the phase interpolator. The phase interpolator can generate a phase shift $\theta$ in $V_{OUT}$ between 0° and 360° relative to the periodic input signals. A desired phase shift in $V_{OUT}$ can be generated by setting the values of $\alpha$ and $\beta$ as a weighted summation of two variable current sources 51-52.

In the system of FIG. 1A, multiplexers in multiplexer block 15 select four of the clock signals C0, C45, C90, C135, C180, C225, C270, and C315 as output clock signals CLKA, CLKB, CLKC, and CLKD based on control signals CS1 from control circuit 10. The four selected clock signals CLKA, CLKB, CLKC, and CLKD are transmitted to slew rate circuits 21-24. Slew rate circuits 21-24 convert clock signals CLKA, CLKB, CLKC, and CLKD into four signals A, B, C, and D that are more sinusoidal in shape. The four sinusoidal signals A-D are transmitted to the gate terminals of transistors 41-44 in phase interpolator 30, respectively. Voltage comparator 71 generates periodic output signals OUT and OUTB at its differential outputs based on the voltage drops generated across resistors 61-62.

The four selected clock signals CLKA, CLKB, CLKC, and CLKD determine which of 8 different 45° wide regions RG0-RG7 between 0° and 360° the phase shifts in OUT and OUTB occur in. FIG. 1C illustrates the 8 regions RG0-RG7 between 0° and 360°. Clock signals C0, C45, C90, C135, C180, C225, C270, and C315 have relative phases of 0°, 45°, 90°, 135°, 180°, 225°, 270°, and 315°, respectively. Multiplexer circuits 101-112 in multiplexer block 15 select the 4 clock signals shown in one of columns 2-9 of Table 1 below as clock signals CLKA, CLKB, CLKC, and CLKD based on control signals CS1 to generate a phase shift in output signal OUT that is within the region RG0-RG7 indicated in the top row of that column. Output signal OUTB is the inverse of output signal OUT.

TABLE 1

| Input Signal | RG0 | RG1 | RG2 | RG3 | RG4 | RG5 | RG6 | RG7 |
|---|---|---|---|---|---|---|---|---|
| A | C0 | C45 | C90 | C135 | C180 | C225 | C270 | C315 |
| B | C180 | C225 | C270 | C315 | C0 | C45 | C90 | C135 |
| C | C45 | C90 | C135 | C180 | C225 | C270 | C315 | C0 |
| D | C225 | C270 | C315 | C0 | C45 | C90 | C135 | C180 |

Control circuit 10 generates control signals CS2 and CS3 for controlling the weight current ratios of current sources 51-52, respectively. Control circuit 10 generates control signals CS1 for selecting the regions RG0-RG7 that the phases of OUT and OUTB are generated in. The currents through current sources 51-52 are varied to change the phase shift of OUT and OUTB within the selected regions RG0-RG7.

BRIEF SUMMARY

According to some embodiments, a phase interpolator circuit includes differential pairs of transistors, current source circuits, and a transimpedance amplifier circuit. Each of the current source circuits is coupled to provide current through one of the differential pairs of transistors. The transimpedance amplifier circuit converts the current through the differential pairs of transistors into a voltage signal.

Various objects, features, and advantages of the present invention will become apparent upon consideration of the following detailed description and the accompanying drawings.

BRIEF DESCRIPTION OF THE DRAWINGS

FIG. 1C illustrates 8 regions RG0-RG7 between 0° and 360° that the phase shifts in the output signals of the phase shifting system of FIG. 1A are generated in.

DETAILED DESCRIPTION

Figure 2:
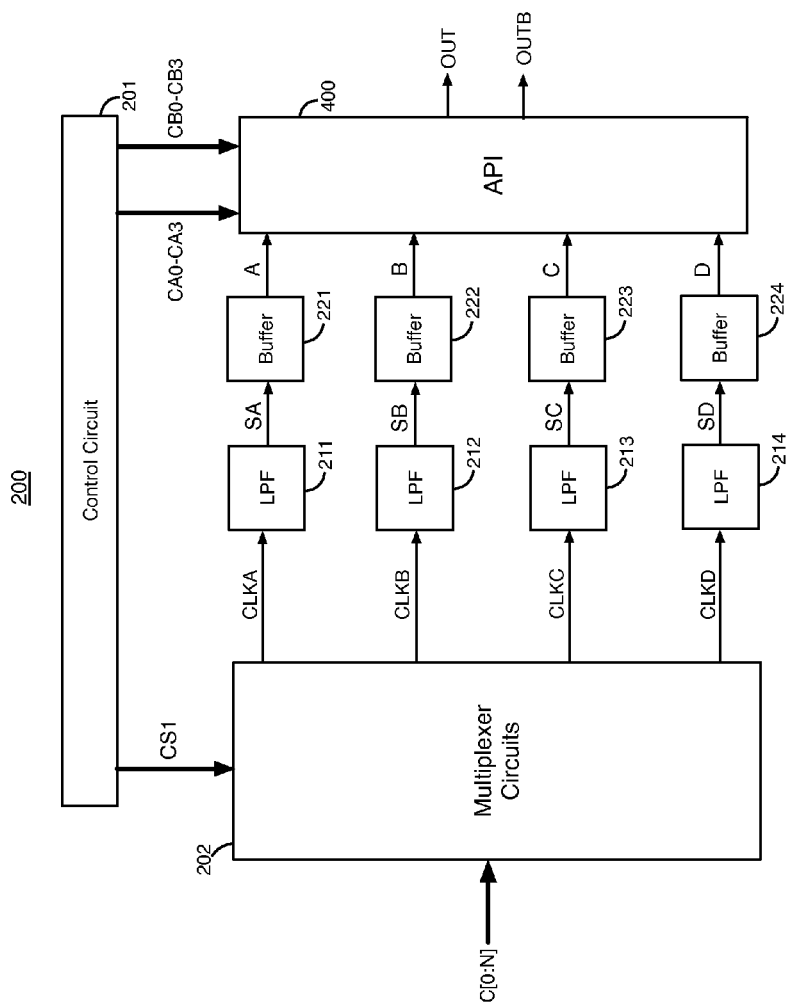
FIG. 2 illustrates an example of a phase shifting system, according to an embodiment of the present invention.

FIG. 2 illustrates an example of a phase shifting system 200, according to an embodiment of the present invention. Phase shifting system 200 includes control circuit 201, multiplexer circuits 202, low pass filter (LPF) circuits 211-214, buffer circuits 221-224, and analog phase interpolator (API) circuit 400. Phase shifting system 200 generates two square wave periodic output signals OUT and OUTB that are out of phase with each other. Output signals OUT and OUTB form a differential signal.

Figure 1A:
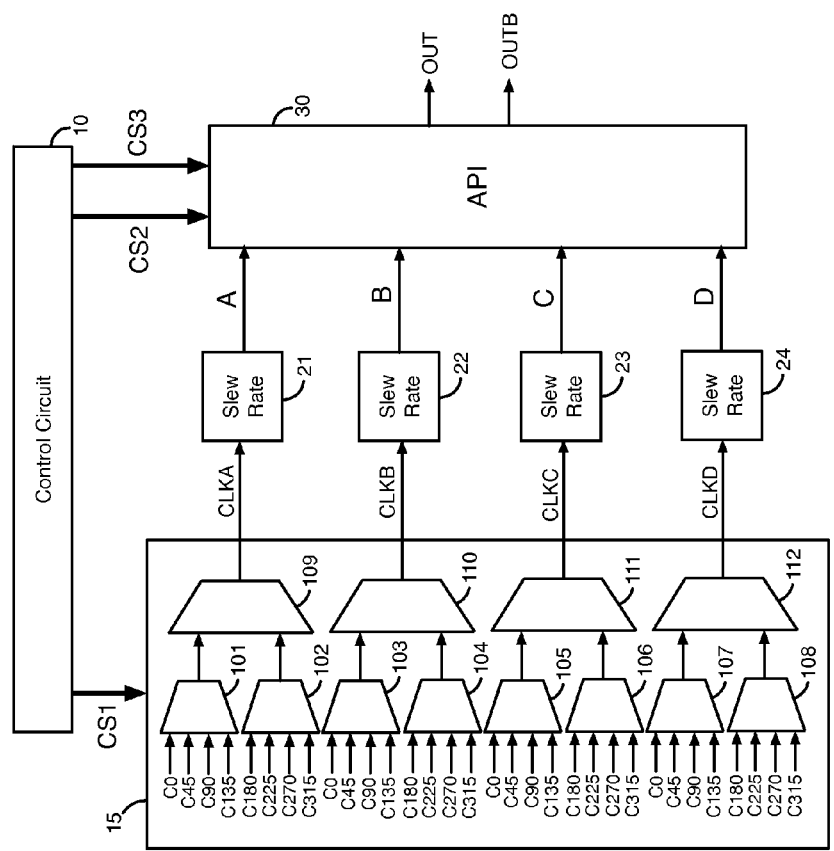
FIG. 1A illustrates a prior art phase shifting system.

In the phase shifting system of FIG. 2, multiplexer circuits 202 receive a number (N+1) of square wave periodic input clock signals C[0:N]. Multiplexer circuits 202 select four of the clock signals C[0:N] as output clock signals CLKA, CLKB, CLKC, and CLKD based on control signals CS1 generated by control circuit 201. The four selected clock signals CLKA, CLKB, CLKC, and CLKD determine the regions (i.e., the potential ranges) of the phase shifts in output signals OUT and OUTB relative to the phases of clock signals C[0:N], for example, as shown in FIG. 1C and Table 1.

The four selected clock signals CLKA, CLKB, CLKC, and CLKD are transmitted to low pass filter (LPF) circuits 211-214, respectively. LPF circuits 211-214 convert square wave clock signals CLKA, CLKB, CLKC, and CLKD into four signals SA, SB, SC, and SD, respectively, that are more sinusoidal in shape.

Signals SA, SB, SC, and SD are provided to inputs of buffer circuits 221-224, respectively. Buffer circuits 221-224 buffer signals SA, SB, SC, and SD to generate buffered signals A, B, C, and D, respectively. The four sinusoidal signals A, B, C, and D are transmitted to inputs of analog phase interpolator (API) circuit 400.

Each of buffer circuits 221-224 has a low output impedance at the output that provides the respective output signal A-D. Because buffer circuits 221-224 have low output impedances, buffer circuits 221-224 shift the input poles at the inputs of API 400 that receive signals A-D to higher frequencies that are greater than the frequencies of signals A-D. Shifting the input poles at the inputs of API 400 that receive signals A-D to frequencies that are larger than the frequencies of signals A-D substantially reduces the phase shifting that these input poles generate in signals A-D.

According to one embodiment, signal A=sin ωt, signal B=−sin ωt, signal C=cos ωt, and signal D=−cos ωt. According to another embodiment, signal A=−cos ωt, signal B=cos ωt, signal C=sin ωt, and signal D=−sin ωt. Thus, signals A-D are sinusoidal signals. API circuit 400 generates periodic output clock signals OUT and OUTB in response to sinusoidal signals A, B, C, and D.

Control circuit 201 generates 8 control signals CA0-CA3 and CB0-CB3. API circuit 400 sets the phases of output clock signals OUT and OUTB based on the logic states of the 8 control signals CA0-CA3 and CB0-CB3 received from control circuit 201. Control circuit 201 adjusts the logic states of control signals CA0-CA3 and CB0-CB3 to cause API circuit 400 to shift the phases of output clock signals OUT and OUTB. API circuit 400 shifts the phases of output clock signals OUT and OUTB based on the changes in the logic states of control signals CA0-CA3 and CB0-CB3.

FIGS. 3A-3D illustrate examples of the buffer circuits 221-224, respectively, in the phase shifting system 200 of FIG. 2, according to embodiments of the present invention. The circuit structures shown in FIGS. 3A-3D for buffer circuits 221-224 are merely examples that are not intended to be limiting.

Figure 3:
FIGS. 3A-3D illustrate examples of the buffer circuits in the phase shifting system of FIG. 2, according to embodiments of the present invention.

As shown in FIG. 3A, buffer circuit 221 includes n-channel metal oxide semiconductor field-effect transistor (MOSFET) 301 and constant current source 302 coupled to the source of transistor 301. The drain of transistor 301 receives supply voltage VCC. Signal SA is provided to the gate of transistor 301. Transistor 301 buffers signal SA to generate buffered signal A at its source. Transistor 301 is a source follower transistor.

As shown in FIG. 3B, buffer circuit 222 includes n-channel MOSFET 311 and constant current source 312 coupled to the source of transistor 311. The drain of transistor 311 receives supply voltage VCC. Signal SB is provided to the gate of transistor 311. Transistor 311 buffers signal SB to generate buffered signal B at its source. Transistor 311 is a source follower transistor.

As shown in FIG. 3C, buffer circuit 223 includes n-channel MOSFET 321 and constant current source 322 coupled to the source of transistor 321. The drain of transistor 321 receives supply voltage VCC. Signal SC is provided to the gate of transistor 321. Transistor 321 buffers signal SC to generate buffered signal C at its source. Transistor 321 is a source follower transistor.

As shown in FIG. 3D, buffer circuit 224 includes n-channel MOSFET 331 and constant current source 332 coupled to the source of transistor 331. The drain of transistor 331 receives supply voltage VCC. Signal SD is provided to the gate of transistor 331. Transistor 331 buffers signal SD to generate buffered signal D at its source. Transistor 331 is a source follower transistor.

The source follower transistors and current source circuits shown in FIGS. 3A-3D for buffer circuits 221-224 have low output impedances that shift the input poles of API 400 at the inputs that receive signals A-D to frequencies that are larger than the frequencies of signals A-D, thereby reducing phase shifting in signals A-D, as described above.

Figure 4:
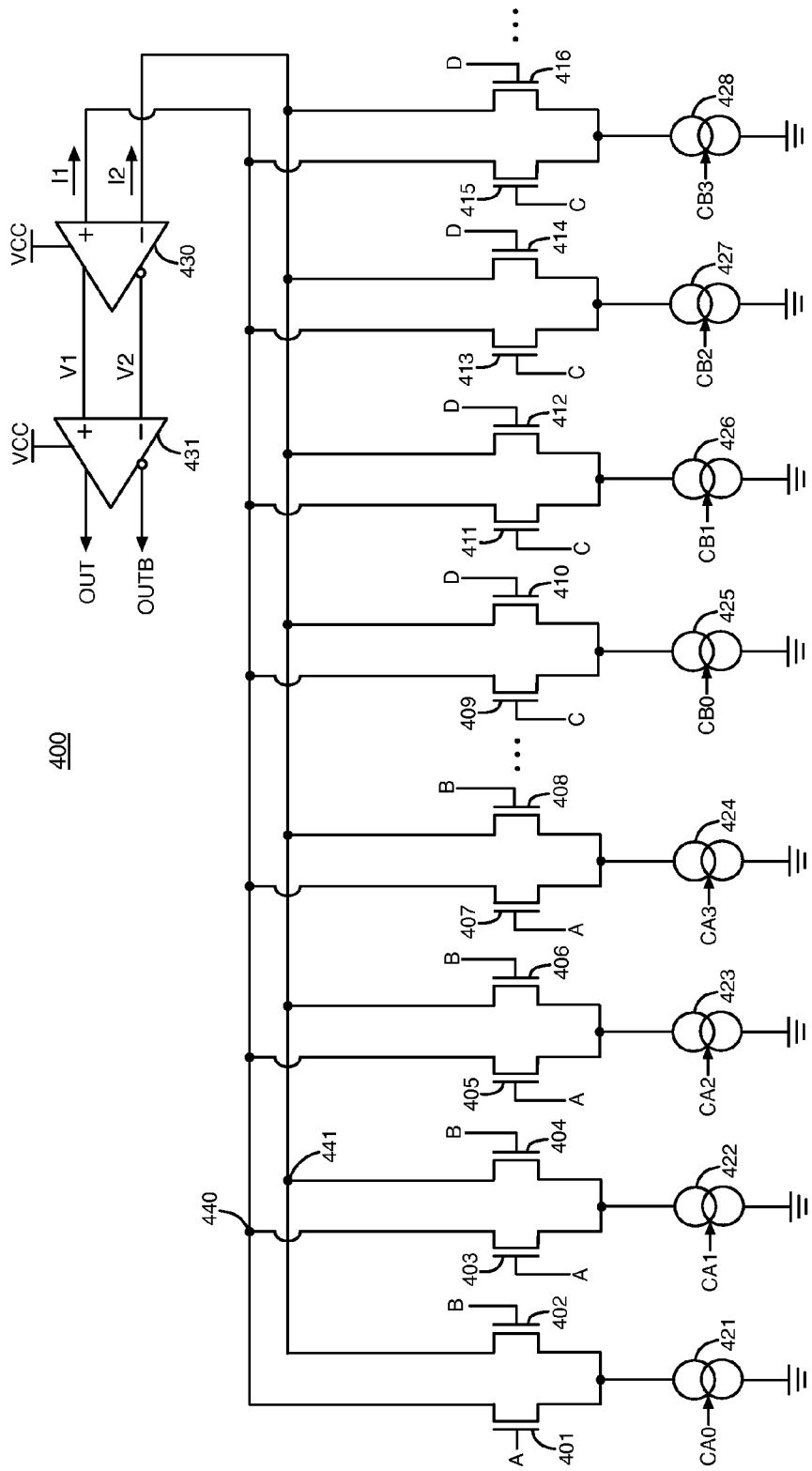
FIG. 4 illustrates an example of an analog phase interpolator (API) circuit in the phase shifting system of FIG. 2, according to an embodiment of the present invention.

FIG. 4 illustrates an example of an analog phase interpolator (API) circuit 400, according to an embodiment of the present invention. API circuit 400 includes 16 n-channel MOSFETs 401-416, 8 current source circuits 421-428, transimpedance amplifier circuit 430, and voltage comparator circuit 431.

Sinusoidal input signal A is provided to the gates of transistors 401, 403, 405, and 407. Sinusoidal input signal B is provided to the gates of transistors 402, 404, 406, and 408. Sinusoidal input signal C is provided to the gates of transistors 409, 411, 413, and 415. Sinusoidal input signal D is provided to the gates of transistors 410, 412, 414, and 416.

Transistors 401-402, 403-404, 405-406, 407-408, 409-410, 411-412, 413-414, and 415-416 are coupled to form 8 differential pairs of transistors. 8 differential pairs of transistors are shown in FIG. 4 as an example. API 400 can have any even number of differential pairs of transistors, such that half of the differential pairs of transistors receive input signals A and B and the other half of the differential pairs of transistors receive input signals C and D.

The drains of transistors 401, 403, 405, 407, 409, 411, 413, and 415 are coupled together at node 440 and to the non-inverting (+) input of transimpedance amplifier 430. The drains of transistors 402, 404, 406, 408, 410, 412, 414, and 416 are coupled together at node 441 and to the inverting (−) input of transimpedance amplifier 430. The non-inverting and inverting outputs of transimpedance amplifier 430 are coupled to the non-inverting (+) and inverting (−) inputs, respectively, of voltage comparator circuit 431. The output clock signals OUT and OUTB are generated at the non-inverting and inverting differential outputs of voltage comparator circuit 431, respectively.

The sources of differential transistor pairs 401-402, 403-404, 405-406, 407-408, 409-410, 411-412, 413-414, and 415-416 are coupled to current source circuits 421-428, respectively. Current source circuits 421-428 are also coupled to a ground node. Transimpedance amplifier 430 converts input current signals I1 and I2 into a differential output voltage signal formed by voltages V1 and V2 at its differential outputs. Transimpedance amplifier 430 is a current-to-voltage converter circuit. Transimpedance amplifier 430 can have any suitable current-to-voltage converter circuit structure. Transimpedance amplifier 430 typically includes active circuits, such as transistors.

Voltage signals V1 and V2 are provided to the non-inverting (+) and inverting (−) inputs of voltage comparator 431, respectively. Voltage comparator 431 generates differential periodic output voltage signals OUT and OUTB in response to input voltage signals V1 and V2. Voltage comparator 431 converts sinusoidal voltage signals V1 and V2 into square wave clock signals OUT and OUTB. Clock signals OUT and OUTB are 180° out of phase with each other.

Current source circuits 421-428 are turned on or off in response to the logic states of digital control signals CA0, CA1, CA2, CA3, CB0, CB1, CB2, and CB3, respectively. Control signals CA0-CA3 and CB0-CB3 are generated by control circuit 201. Control circuit 201 sets the control signals CA0-CA3 and CB0-CB3 to logic states that cause one or more of current sources 421-424 to be on and one or more of current sources 425-428 to be on. Control circuit 201 varies the logic states of the control signals CA0-CA3 and CB0-CB3 in order to adjust the phases of output clock signals OUT and OUTB relative to the phases of signals CLKA-CLKD.

Each of the current sources 421-428 sinks a constant current to ground when it is on that equals the same constant current generated by each of the other current sources 421-428 when the respective current sources are on. Each of the current sources 421-428 sinks zero current when it is off. The current sources 421-428 that are on provide tail current for the respective differential transistor pairs that those current sources are coupled to. Each transistor 401-416 is on if that transistor is coupled to a current source circuit 421-428 that is on. Each transistor 401-416 is off if that transistor is coupled to a current source circuit 421-428 that is off.

In API 400, control circuit 201 causes the total number of differential transistor pairs 401-416 that are on to remain the same in response to each of the changes in the conductive states of the current source circuits 421-428 that are caused by changing the control signals CA0-CA3 and CB0-CB3.

Thus, the total number of transistors 401, 403, 405, 407, 409, 411, 413, and 415 coupled to node 440 that are on remains the same, and the total number of transistors 402, 404, 406, 408, 410, 412, 414, and 416 coupled to node 441 that are on remains the same, in response to each change in the conductive states of current sources 421-428 that are caused by changing the control signals CA0-CA3 and CB0-CB3.

Because the total number of differential transistor pairs 401-416 that are on remains the same in response to each change in the control signals CA0-CA3 and CB0-CB3, and the tail currents are equal through the current source circuits 421-428 that are on, the effective output poles of the differential transistor pairs 401-416 at nodes 440-441 remain constant in response to each change in the control signals CA0-CA3 and CB0-CB3. As a result, API 400 increases the phase linearity in periodic output signals OUT and OUTB.

Table 2 below shows examples of 4 different steps corresponding to different phase shifts that phase shifting system 200 can generate in output clock signals OUT and OUTB relative to signals CLKA-CLKD by varying the logic states of control signals CA0-CA3 and CB0-CB3. Control circuit 201 generates logic states in the control signals CA0-CA3 and CB0-CB3 that cause one or more of current source circuits 421-424 to be on and one or more of current source circuits 425-428 to be on. As shown in Table 2, when control circuit 201 turns off one or more of current sources 421-424, control circuit 201 turns on the same number of current sources 425-428. When control circuit 201 turns off one or more of current sources 425-428, control circuit 201 turns on the same number of current sources 421-424. Thus, control circuit 201 causes the same number of current sources and the same number of differential pairs of transistors to be on at the same time for each of the four steps 1-4 shown in Table 2.

TABLE 2

|     | Step 1 | Step 2 | Step 3 | Step 4 |
| --- | --- | --- | --- | --- |
| CA0 | ON  | ON  | ON  | ON  |
| CA1 | OFF | ON  | ON  | ON  |
| CA2 | OFF | OFF | ON  | ON  |
| CA3 | OFF | OFF | OFF | ON  |
| CB0 | ON  | ON  | ON  | ON  |
| CB1 | ON  | ON  | ON  | OFF |
| CB2 | ON  | ON  | OFF | OFF |
| CB3 | ON  | OFF | OFF | OFF |

In step 1 shown in Table 2, current source circuits 421 and 425-428 are on, transistors 401-402 and 409-416 are on, current source circuits 422-424 are off, and transistors 403-408 are off. In step 1, API 400 generates periodic output signals OUT and OUTB having first phase shifts relative to signals CLKA-CLKD. In step 2 shown in Table 2, current source circuits 421-422 and 425-427 are on, transistors 401-404 and 409-414 are on, current source circuits 423-424 and 428 are off, and transistors 405-408 and 415-416 are off. In step 2, API 400 generates periodic output signals OUT and OUTB having second phase shifts relative to signals CLKA-CLKD.

In step 3 shown in Table 2, current source circuits 421-423 and 425-426 are on, transistors 401-406 and 409-412 are on, current source circuits 424 and 427-428 are off, and transistors 407-408 and 413-416 are off. In step 3, API 400 generates periodic output signals OUT and OUTB having third phase shifts relative to signals CLKA-CLKD. In step 4 shown in Table 2, current source circuits 421-425 are on, transistors 401-410 are on, current source circuits 426-428 are off, and transistors 411-416 are off. In step 4, API 400 generates periodic output signals OUT and OUTB having fourth phase shifts relative to signals CLKA-CLKD. The first, second, third, and fourth phase shifts that API 400 generates in OUT and OUTB are unique phase shifts relative each other.

Control circuit 201 causes five of the current sources 421-428 to be on and three of the current sources 421-428 to be off in each of the steps 1-4 shown in Table 2. For this reason, and because the tail currents are the same in the current source circuits 421-428 that are on, the effective output poles of the differential transistor pairs 401-416 at nodes 440-441 remain constant or nearly constant for each of the steps 1-4. As a result, the phase shift introduced by these effective output poles in the output signals OUT and OUTB of API 400 is constant or nearly constant for each of the phase shifts represented by steps 1-4. For example, the effective output poles of API 400 at nodes 440-441 may add a constant phase shift of X degrees to output signals OUT and OUTB in each of steps 1-4. Thus, API 400 increases the phase linearity between the phase shifts that are generated in OUT and OUTB.

A plotted phase response of the output signals OUT and OUTB of API 400 has the same shape as the function Arctan($\beta/\alpha$). Although, the phase response of the output signals OUT and OUTB of API 400 is phase shifted relative to Arctan($\beta/\alpha$). The phase shift introduced by the effective output poles of API 400 into the output signals OUT and OUTB can be canceled to generate an output phase response that equals Arctan($\beta/\alpha$).

Table 3 below illustrates examples of phases that can be generated in the output signal OUT of API 400. The examples shown in Table 3 are based on control signals CA0-CA3 controlling current $\alpha$ through transistors 401-408, and control signals CB0-CB3 controlling current $\beta$ through transistors 409-416. In the examples shown in Table 3, input signal A is sin($\omega$t), input signal B is –sin($\omega$t), input signal C is cos($\omega$t), and input signal D is –cos($\omega$t). In Table 3, $\beta/\alpha$ is the number of differential pairs 401-402, 403-404, 405-406, 407-408 that are on divided by the number of differential pairs 409-410, 411-412, 413-414, 415-416 that are on.

TABLE 3

| Step | $\beta/\alpha$ | Output Phase $\theta$ = Arctan($\beta/\alpha$) |
|---|---|---|
| 1 | 4/1 | 75.96° |
| 2 | 3/2 | 56.31° |
| 3 | 2/3 | 33.69° |
| 4 | 1/4 | 14.04° |

Figure 1B:
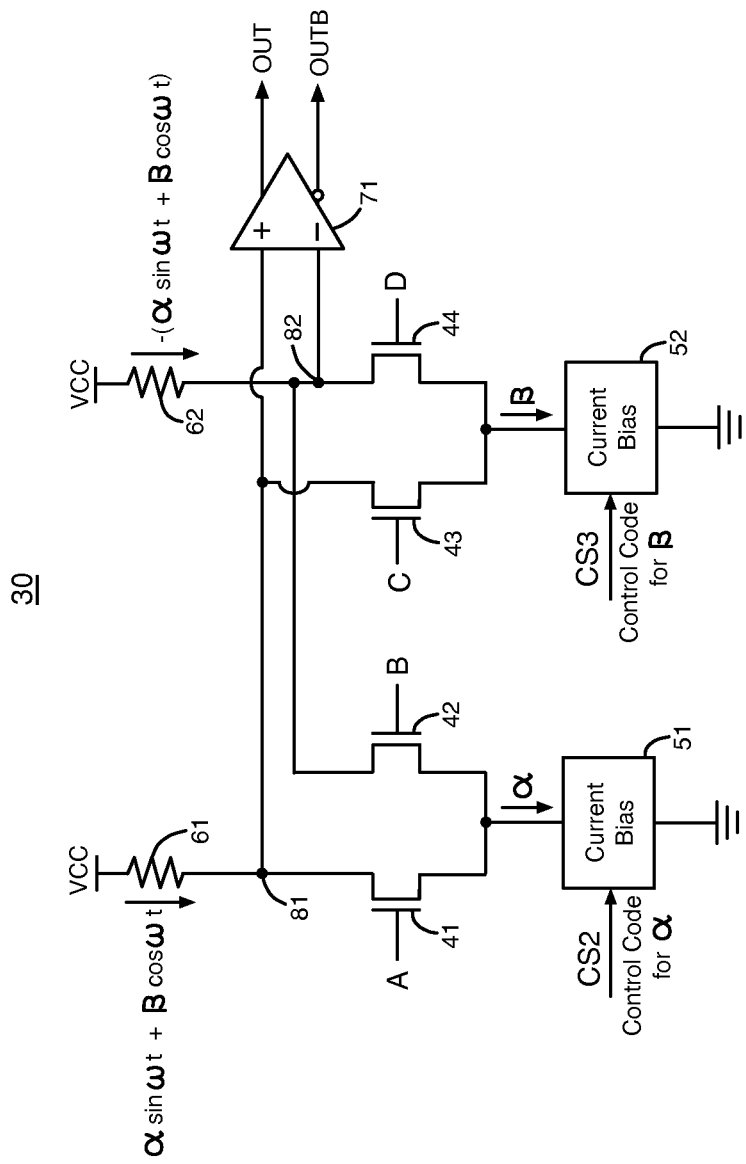
FIG. 1B is a diagram of the analog phase interpolator shown in FIG. 1.
Figure 1C:
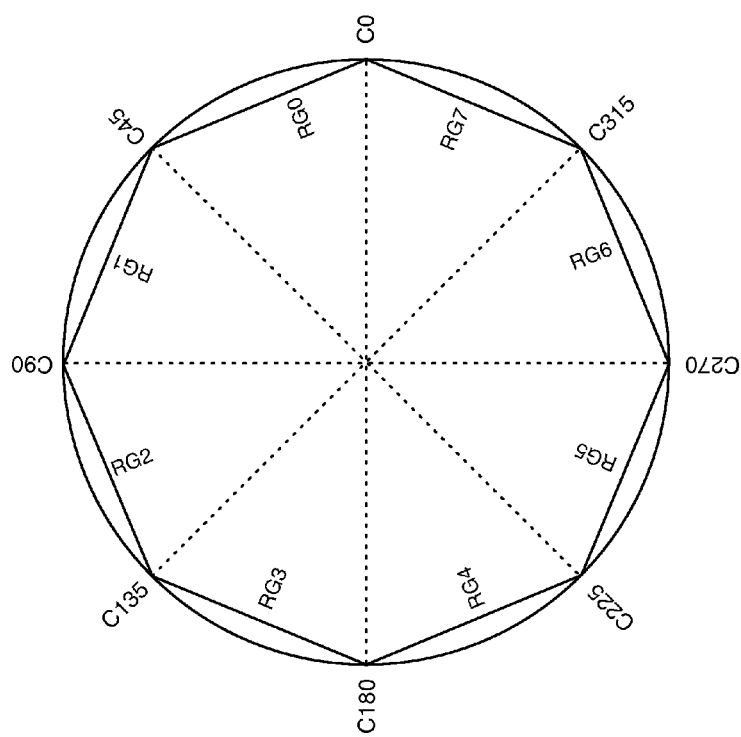

Referring to FIG. 1B, parasitic and stray capacitances at current summation nodes 81-82 in API 30 cause nonlinearity in the phase shifts that are generated in output signals OUT and OUTB. The parasitic and stray capacitances at nodes 81-82 cause 90° out-of-phase currents that are added to the currents generated by transistors 41-44. Phase nonlinearity in the phase shifts generated in output signals OUT and OUTB arises in API 30 if there are routing mismatches between the current summation nodes 81-82 or changes in the amplitudes of the voltage swings at current summation nodes 81-82 between each phase shift generated in OUT and OUTB.

The stray and parasitic capacitances at the current summation nodes typically cannot be completely eliminated. The load resistances of resistors 61-62 would need to be reduced to achieve a higher operation frequency and to reduce nonlinearity in the output phase shifts. However, resistors 61-62 in API 30 cannot be reduced sufficiently to provide an adequate reduction of the nonlinearity in the output phase shifts in OUT and OUTB. In addition, the input capacitance of voltage comparator 71 would increase significantly if the voltage swing at nodes 81-82 is too small. Resistors 61-62 cause the output phase linearity performance of API 30 to decrease in response to increasing the frequency of OUT and OUTB.

Referring again to FIG. 4, API 400 generates currents I1 and I2. I1 is the total current flowing from the non-inverting (+) input of transimpedance amplifier 430 through the transistors 401, 403, 405, 407, 409, 411, 413, and 415 coupled to node 440 that are on. I2 is the total current flowing from the inverting (–) input of transimpedance amplifier 430 through the transistors 402, 404, 406, 408, 410, 412, 414, and 416 coupled to node 441 that are on. Transimpedance amplifier 430 draws currents I1 and I2 using charge from a supply voltage VCC. Transimpedance amplifier 430 converts currents I1 and I2 into a differential voltage signal formed by voltages V1 and V2 at its differential outputs. API 400 does not have load resistors coupled between transistors 401-416 and the supply voltage node at VCC.

Transimpedance amplifier 430 has a relatively small input impedance. As a result, transimpedance amplifier 430 reduces the voltage swing at current summation nodes 440-441, which reduces the 90° out-of-phase current flowing through the stray and parasitic capacitors at nodes 440-441. Reducing the current flowing through the stray and parasitic capacitors at nodes 440-441 increases the output phase linearity between the phase shifts that are generated in output signals OUT and OUTB. Because API 400 provides an increased output phase linearity in OUT and OUTB, a smaller number of input clock signals C[0:N] are needed to generate the same number of phases in the output clock signals OUT and OUTB of API 400 compared to API 30. Because a smaller number of input clock buffers are used to buffer the smaller number of input clock signals C[0:N], the total power consumption of system 200 is reduced compared to the system of FIG. 1A.

Referring again to FIG. 1B, API 30 has a minimum operational supply voltage $V_{CC(MIN)}$ that is based on the voltage drops shown below in equation (4).

$$V_{CC(MIN)} = V_{TAIL(SAT)} + V_{DIFF(SAT)} + V_{VC(CM)} + V_{OUTP-P} \quad (4)$$

In equation (4), $V_{TAIL(SAT)}$ is the saturation voltage of current sources 51-52, $V_{DIFF(SAT)}$ is the saturation voltage of transistors 41-44, $V_{VC(CM)}$ is the minimum input common-mode voltage of voltage comparator 71 with respect to supply voltage VCC, and $V_{OUTP-P}$ is the desired peak-to-peak voltage swing at nodes 81-82.

Referring to FIG. 4, API 400 has a minimum operational supply voltage $V_{CC(MIN)}$ that is based on the voltage drops shown below in equation (5).

$$V_{CC(MIN)} = V_{TAIL(SAT)} + V_{DIFF(SAT)} + V_{TIA(CM)} \quad (5)$$

In equation (5), $V_{TAIL(SAT)}$ is the saturation voltage of current sources 421-428, $V_{DIFF(SAT)}$ is the saturation voltage of transistors 401-416, and $V_{TIA(CM)}$ is the minimum input common-mode voltage of transimpedance amplifier 430 with respect to VCC.

API 400 does not require a large voltage swing at current summation nodes 440-441. If transimpedance amplifier 430 has a minimum input common-mode voltage that is comparable to the minimum input common-mode voltage of voltage comparator 71 in API 30 (i.e., $V_{TIA(CM)} \approx V_{VC(CM)}$), API 400 can operate at a lower minimum operational supply voltage $V_{CC(MIN)}$ than API 30, as shown in equations (4) and (5). A lower minimum operational supply voltage $V_{CC(MIN)}$ allows API 400 to be implemented in smaller dimension process nodes having a smaller operational voltage. The lower minimum operational supply voltage $V_{CC(MIN)}$ also reduces the power consumption of API 400. Transimpedance amplifier 430 can, for example, have a folded-cascode circuit that reduces the voltage headroom requirement of API 400.

Some clock data recovery (CDR) circuits have multiple analog phase interpolators (APIs). Each API in the CDR circuit has a voltage comparator. Each of the voltage comparators generates a differential output signal having a unique phase. Matching the delay between the voltage comparators in a CDR circuit is more challenging in systems that generate a large number of output signals having different phases. Differences in the input offset voltages between the voltage comparators in a CDR circuit can cause an output-to-output phase error between the output signals generated by the voltage comparators.

Figure 5B:
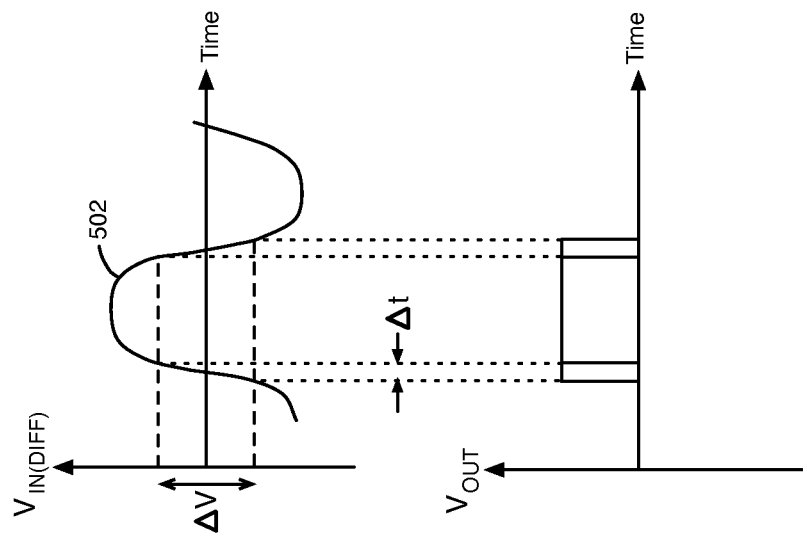
FIGS. 5A-5B illustrate two exemplary sinusoidal waveforms of the differential input voltages to two voltage comparators in two analog phase interpolators (APIs).
Figure 5A:
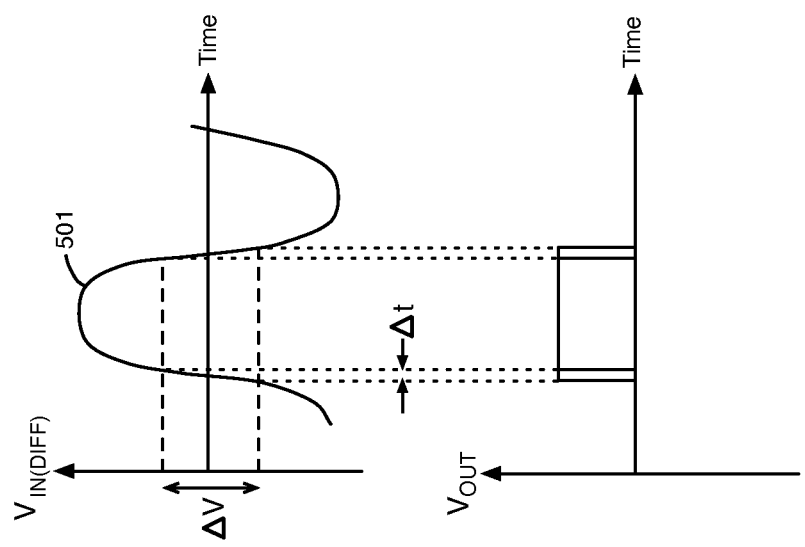

FIGS. 5A-5B illustrate two exemplary sinusoidal waveforms 501-502 of the differential input voltages $V_{IN(DIFF)}$ to two voltage comparators in two analog phase interpolators (APIs). In FIGS. 5A-5B, the difference ΔV in the input offset voltage between two different voltage comparators in two different APIs causes a phase error Δt between the periodic output signals $V_{OUT}$ of the voltage comparators. The phase error Δt between the periodic output signals $V_{OUT}$ of the voltage comparators is larger in FIG. 5B than in FIG. 5A, because the amplitude of the input sinusoidal wave 502 to the voltage comparator is smaller in FIG. 5B than the amplitude of the input sinusoidal wave 501 to the voltage comparator in FIG. 5A.

The input offset voltage can be reduced by increasing the size of the input differential transistors of the voltage comparator. However, increasing the size of the input differential transistors of the voltage comparator increases the effective input capacitance of the voltage comparator. Increasing the effective input capacitance of the voltage comparator at the current summation nodes can decrease the output phase linearity performance of the API.

Transimpedance amplifier 430 amplifies the voltage swings of voltages V1 and V2 relative to the voltage swings at nodes 440-441, respectively, before voltages V1-V2 are provided to the differential inputs of voltage comparator 431. As a result, API 400 reduces the output-to-output phase error between the differential output signal OUT/OUTB generated by API 400 and the output signals of other APIs in the same system. Voltage comparator 431 is able to generate a sufficient voltage swing in output signals OUT and OUTB, without having input differential transistors having large sizes. These features allow API 400 to provide an increased phase linearity in the output signals OUT and OUTB.

In an embodiment, API 400 can be implemented in a clock data recovery (CDR) circuit. A CDR circuit can phase align a high frequency clock signal generated by API 400 to an input data signal having a high data rate. API 400 can generate periodic square wave output clock signals OUT and OUTB that have lower jitter than the output signals OUT and OUTB generated by API 30. API 400 also consumes less power than API 30, and API 400 can function with a lower operational supply voltage VCC than API 30, as described above. API 400 can be used with process nodes having a lower operation voltage than in API 30, without degradation in the phase response of output signals OUT and OUTB.

Figure 6B:
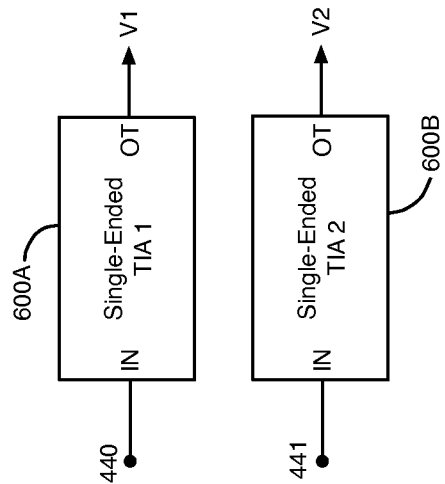
FIGS. 6A-6B illustrate an example of a transimpedance amplifier circuit that can be used in the API circuit of FIG. 4, according to an embodiment of the present invention.
Figure 6A:
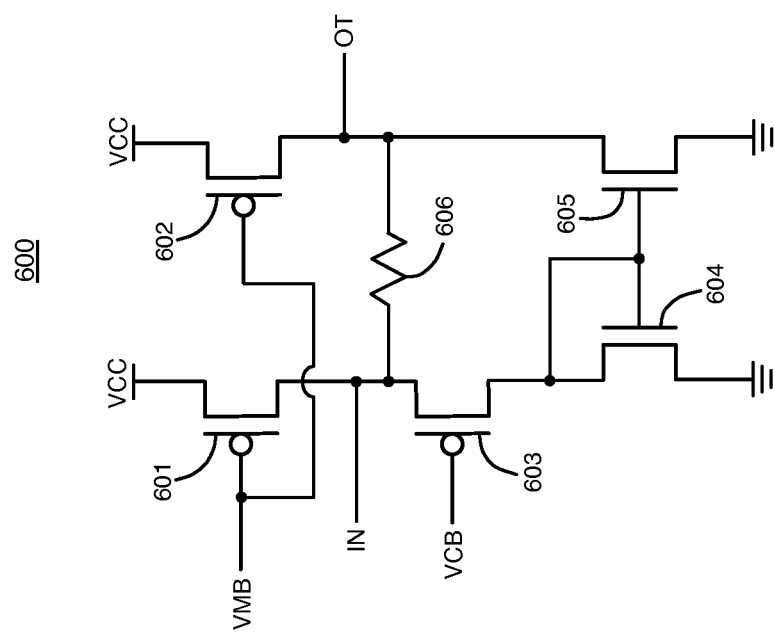

FIG. 6A illustrates an example of a single-ended transimpedance amplifier circuit 600, according to an embodiment of the present invention. Transimpedance amplifier circuit 600 includes p-channel MOSFETs 601-603, n-channel MOSFETs 604-605, and resistor 606. Transistors 604-605 are coupled to form a current mirror circuit. Transistors 601-602 are biased by a constant voltage VMB. Cascode transistor 603 is biased by a constant bias voltage VCB. Resistor 606 is coupled between the input node that receives input signal IN and the output node that generates output signal OT. Transimpedance amplifier circuit 600 amplifies input signal IN to generate output signal OT.

In an embodiment, two single-ended transimpedance amplifier circuits 600A and 600B, as shown in FIG. 6B, are used to implement transimpedance amplifier 430 in API 400. Each of the transimpedance amplifier circuits 600A-600B has the circuit structure shown in FIG. 6A. Input signal IN is the voltage at node 440 in the first single-ended transimpedance amplifier circuit (TIA) 600A, and input signal IN is the voltage at node 441 in the second single-ended transimpedance amplifier (TIA) circuit 600B. Output signal OT is voltage V1 in the first single-ended transimpedance amplifier circuit 600A, and output signal OT is voltage V2 in the second single-ended transimpedance amplifier circuit 600B.

Transimpedance amplifier circuit 600 is merely one example of a transimpedance amplifier circuit that can be used to implement transimpedance amplifier circuit 430 in API 400. In other embodiments, transimpedance amplifier circuits having different circuit configurations are used to implement the transimpedance circuit 430 in API 400.

Figure 7B:
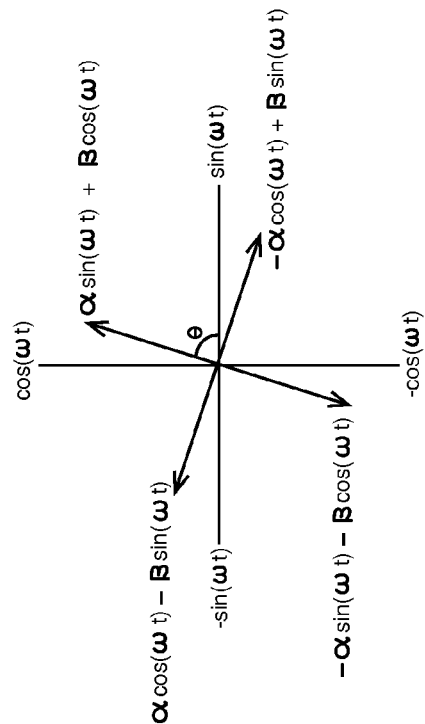
FIG. 7B is a graph that illustrates examples of the relative phases of periodic signals generated by the APIs shown in FIG. 7A.
Figure 7A:
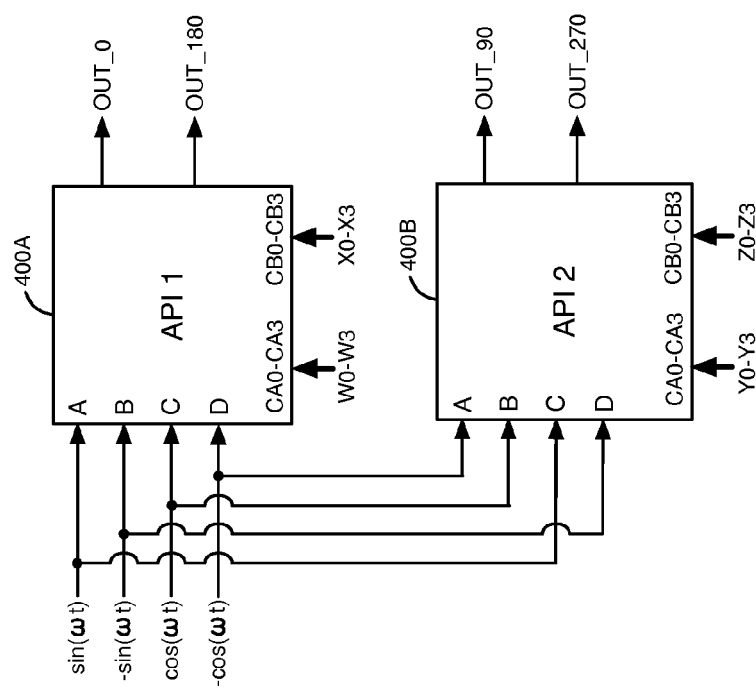
FIG. 7A illustrates an example of two analog phase interpolators that each generate two output clock signals in response to the same four sinusoidal input signals, according to another embodiment of the present invention.

FIG. 7A illustrates examples of two analog phase interpolators 400A and 400B that each generate two output clock signals in response to the same four sinusoidal input signals, according to another embodiment of the present invention. The circuit structure of each of the analog phase interpolators (APIs) 400A and 400B in FIG. 7A is the same as the circuit structure of API 400 shown in FIG. 4. APIs 400A-400B function as described above with respect to API 400.

Four sinusoidal input signals sin ωt, −sin ωt, cos ωt, and −cos ωt are provided to four inputs of each of APIs 400A and 400B. Sinusoidal input signals sin ωt, −sin ωt, cos ωt, and −cos ωt can, for example, be generated by low pass filters and buffer circuits, such as LPFs 211-214 and buffer circuits 221-224, in response to four selected square wave input clock signals.

In API 400A, sinusoidal input signals sin ωt, −sin ωt, cos ωt, and −cos ωt are input signals A, B, C, and D, respectively, in FIG. 4. Thus, input signal sin ωt is provided to the gates of transistors 401, 403, 405, and 407. Input signal −sin ωt is provided to the gates of transistors 402, 404, 406, and 408. Input signal cos ωt is provided to the gates of transistors 409, 411, 413, and 415. Input signal −cos ωt is provided to the gates of transistors 410, 412, 414, and 416. In API 400A, voltage comparator 431 generates periodic output clock signals OUT_0 and OUT_180 at its outputs. Clock signals OUT_0 and OUT_180 are 180° out of phase with each other.

In API 400A, control signals W0-W3 and X0-X3 are control signals CA0-CA3 and CB0-CB3, respectively, in FIG. 4. Thus, control signals W0-W3 and X0-X3 control the conductive states of current source circuits 421-428, respectively, in API 400A. API 400A varies the phases of clock signals OUT_0 and OUT_180 in response to changes in control signals W0-W3 and X0-X3, as described above with respect to FIG. 4.

In API 400B, sinusoidal input signals −cos ωt, cos ωt, sin ωt, and −sin ωt are input signals A, B, C, and D, respectively, in FIG. 4. Thus, input signal −cos ωt is provided to the gates of transistors 401, 403, 405, and 407. Input signal cos ωt is provided to the gates of transistors 402, 404, 406, and 408. Input signal sin ωt is provided to the gates of transistors 409, 411, 413, and 415. Input signal −sin ωt is provided to the gates of transistors 410, 412, 414, and 416. In API 400B, voltage comparator 431 generates periodic output clock signals OUT_90 and OUT_270 at its outputs. Clock signals OUT_90 and OUT_270 are 180° out of phase with each other. Clock signals OUT_0, OUT_90, OUT_180, and OUT_270 have relative phase offsets of 0°, 90°, 180°, and 270°, respectively.

In API 400B, control signals Y0-Y3 and Z0-Z3 are control signals CA0-CA3 and CB0-CB3, respectively, in FIG. 4. Thus, control signals Y0-Y3 and Z0-Z3 control the conductive states of current source circuits 421-428, respectively, in API 400B. API 400B varies the phases of clock signals OUT_90 and OUT_270 in response to changes in control signals Y0-Y3 and Z0-Z3, as described above with respect to FIG. 4.

Table 4 below shows examples of 4 different steps corresponding to 4 different phase shifts that APIs 400A and 400B generate in output clock signals OUT_0/OUT_180 and OUT_90/OUT_270 relative to the sinusoidal input signals by varying control signals W0-W3, X0-X3 and Y0-Y3, Z0-Z3, respectively.

TABLE 4

|    | Step 1 | Step 2 | Step 3 | Step 4 |
|----|--------|--------|--------|--------|
| W0 | ON     | ON     | ON     | ON     |
| W1 | OFF    | ON     | ON     | ON     |
| W2 | OFF    | OFF    | ON     | ON     |
| W3 | OFF    | OFF    | OFF    | ON     |
| X0 | ON     | ON     | ON     | ON     |
| X1 | ON     | ON     | ON     | OFF    |
| X2 | ON     | ON     | OFF    | OFF    |
| X3 | ON     | OFF    | OFF    | OFF    |
| Y0 | ON     | ON     | ON     | ON     |
| Y1 | OFF    | ON     | ON     | ON     |
| Y2 | OFF    | OFF    | ON     | ON     |
| Y3 | OFF    | OFF    | OFF    | ON     |
| Z0 | ON     | ON     | ON     | ON     |
| Z1 | ON     | ON     | ON     | OFF    |
| Z2 | ON     | ON     | OFF    | OFF    |
| Z3 | ON     | OFF    | OFF    | OFF    |

As shown in Table 4, each of APIs 400A and 400B causes five of the current source circuits 421-428 to be on and three of the current source circuits 421-428 to be off in each of steps 1-4. As a result, the load capacitance and the effective output poles at nodes 440-441 remain constant in response to changes in the control signals W0-W3, X0-X3 or Y0-Y3, Z0-Z3 between steps 1-4, as described above.

FIG. 7B is a graph that illustrates examples of the relative phases of periodic signals generated by APIs 400A-400B. API 400A generates periodic signal α sin(ωt)+β cos(ωt) at node 440 and periodic signal −α sin(ωt)−β cos(ωt) at node 441. API 400B generates periodic signal −α cos(ωt)+β sin(ωt) at node 440 and periodic signal α cos(ωt)−β sin(ωt) at node 441.

Figure 8:
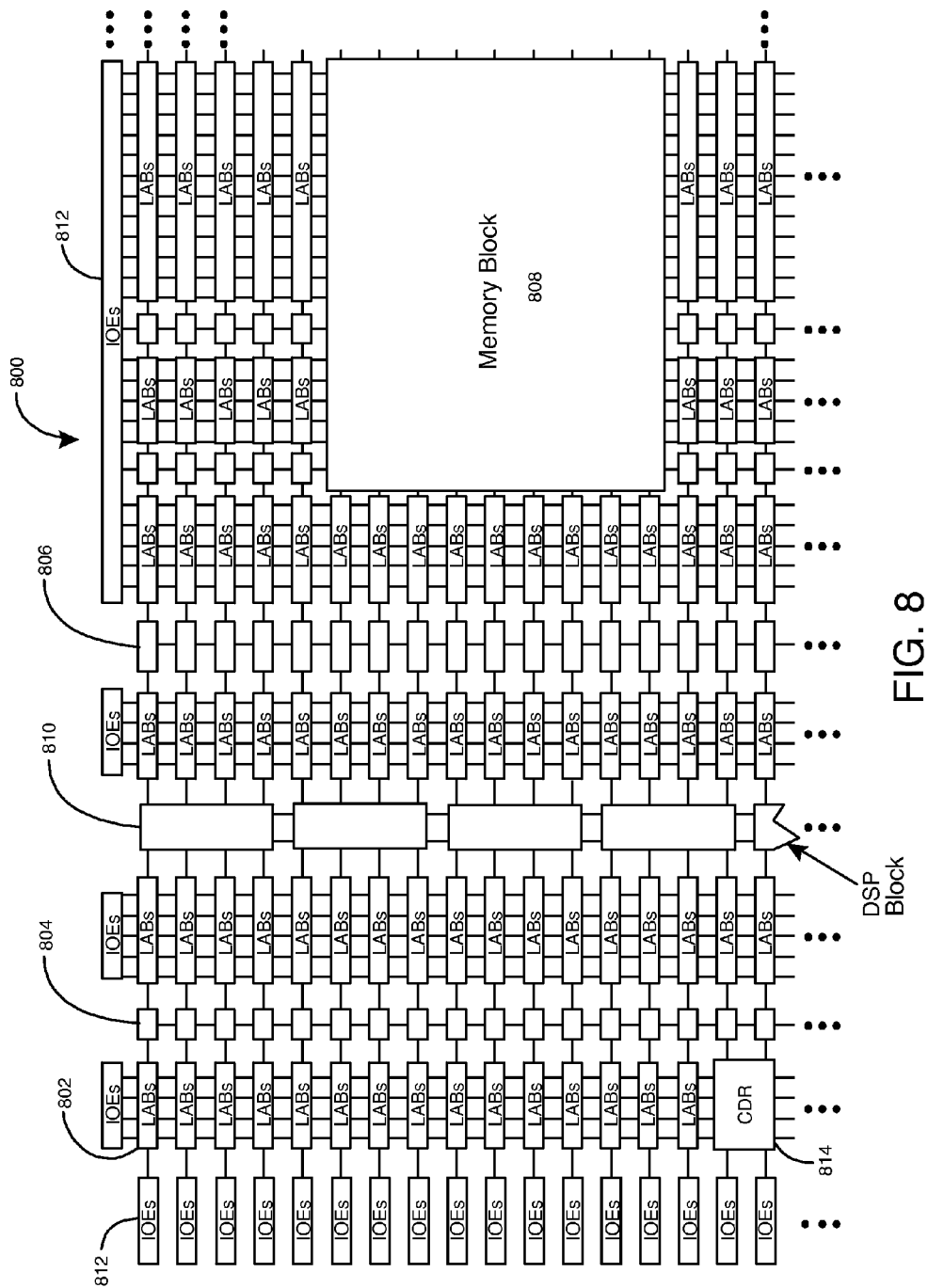
FIG. 8 is a simplified partial block diagram of a field programmable gate array (FPGA) that can include aspects of the present invention.

FIG. 8 is a simplified partial block diagram of a field programmable gate array (FPGA) 800 that can include aspects of the present invention. FPGA 800 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 800 includes a two-dimensional array of programmable logic array blocks (or LABs) 802 that are interconnected by a network of column and row interconnect conductors of varying length and speed. LABs 802 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including random access memory (RAM) blocks of varying sizes provided throughout the array. The RAM blocks include, for example, blocks 804, blocks 806, and block 808. These memory blocks can also include shift registers and first-in-first-out (FIFO) buffers.

FPGA 800 further includes digital signal processing (DSP) blocks 810 that can implement, for example, multipliers with add or subtract features. Input/output elements (IOEs) 812 located, in this example, around the periphery of the chip, support numerous single-ended and differential input/output standards. IOEs 812 include input and output buffers that are coupled to pads of the integrated circuit. The pads are external terminals of the FPGA die that can be used to route, for example, input signals, output signals, and supply voltages between the FPGA and one or more external devices. FPGA 800 also has a CDR circuit 814 that includes a phase shifting system, such as phase shifting system 200. It is to be understood that FPGA 800 is described herein for illustrative purposes only and that the present invention can be implemented in many different types of integrated circuits.

Figure 9:
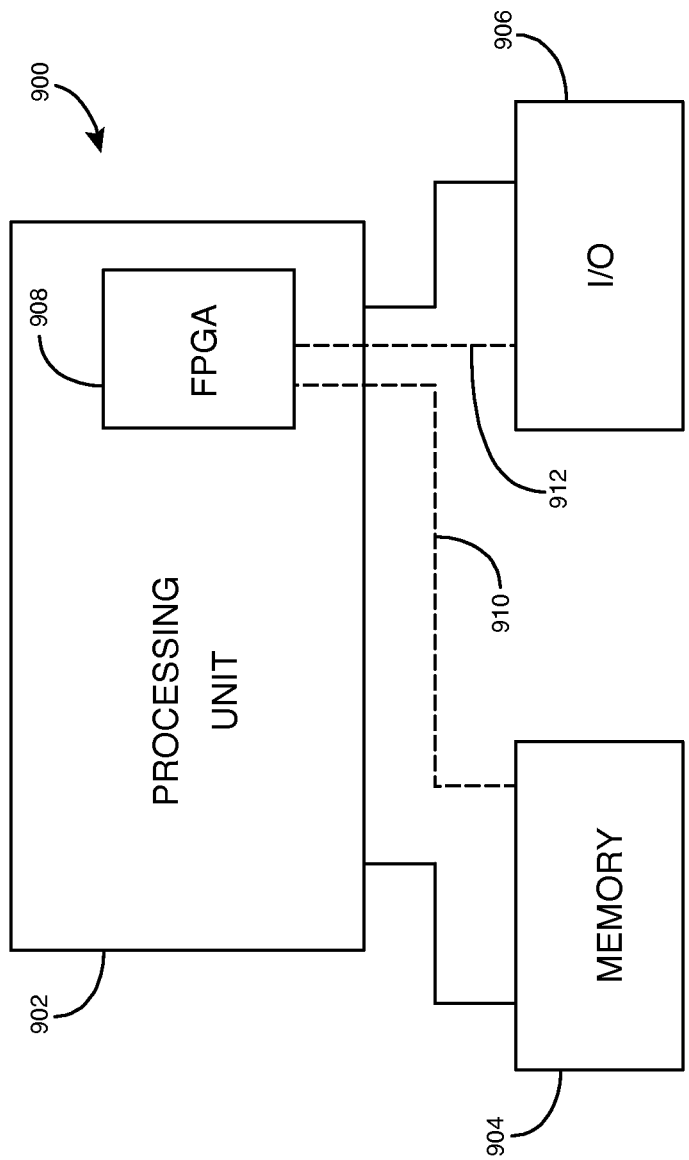
FIG. 9 shows a block diagram of an exemplary digital system that can embody techniques of the present invention.

The present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904, and an input/output (I/O) unit 906 interconnected together by one or more buses. According to this exemplary embodiment, an FPGA 908 is embedded in processing unit 902. FPGA 908 can serve many different purposes within the system of FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904, receive and transmit data via I/O unit 906, or other similar functions. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor that can be reprogrammed as needed to handle a particular computing task. Alternatively, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A phase interpolator circuit comprising:
    differential pairs of transistors;
    current source circuits, wherein each of the current source circuits is coupled to provide current through one of the differential pairs of transistors;
    a transimpedance amplifier circuit that converts the current through the differential pairs of transistors into a voltage signal at an output, wherein inputs of the transimpedance amplifier circuit are coupled to the differential pairs of transistors, and wherein the output of the transimpedance amplifier circuit is a different node than either of the inputs of the transimpedance amplifier circuit; and
    a voltage comparator that generates a periodic signal in response to the voltage signal generated by the transimpedance amplifier circuit, wherein an input of the voltage comparator is coupled to the output of the transimpedance amplifier circuit.

2. The phase interpolator circuit of claim 1 wherein the current through each of the current source circuits is turned on and turned off in response to changes in a respective control signal, and wherein each of the current source circuits is coupled to only one of the differential pairs of transistors.

3. The phase interpolator circuit of claim 1 wherein a number of transistors in the differential pairs of transistors that are coupled to a first input of the transimpedance amplifier circuit and that are on when a first one of the current source circuits is off equals a number of the transistors in the differential pairs of transistors that are coupled to the first input of the transimpedance amplifier circuit and that are on when the first one of the current source circuits is on.

4. The phase interpolator circuit of claim 3 wherein a number of transistors in the differential pairs of transistors that are coupled to a second input of the transimpedance amplifier circuit and that are on when a second one of the current source circuits is off equals a number of the transistors in the differential pairs of transistors that are coupled to the second input of the transimpedance amplifier circuit and that are on when the second one of the current source circuits is on.

5. The phase interpolator circuit of claim 1 wherein the transimpedance amplifier circuit comprises a current mirror circuit.

6. The phase interpolator circuit of claim 5 wherein the transimpedance amplifier circuit comprises a cascode transistor coupled to the current mirror circuit.

7. The phase interpolator circuit of claim 1 wherein a first one of the differential pairs of transistors is coupled to receive a first sinusoidal signal at a first control input and a second sinusoidal signal at a second control input, and wherein a second one of the differential pairs of transistors is coupled to receive a third sinusoidal signal at a first control input and a fourth sinusoidal signal at a second control input.

8. The phase interpolator circuit of claim 1 wherein:
    the differential pairs of transistors comprise at least three of the differential pairs of transistors;
    the current source circuits comprise at least three of the current source circuits, and
    the transimpedance amplifier circuit converts the current through the three differential pairs of transistors into the voltage signal.

9. The phase interpolator circuit of claim 1 wherein first transistors in the differential pairs of transistors are coupled to a first input of the transimpedance amplifier circuit, wherein second transistors in the differential pairs of transistors are coupled to a second input of the transimpedance amplifier circuit, and wherein effective poles at the first and the second inputs of the transimpedance amplifier circuit remain constant before and after each change in the conductive states of the current source circuits that are caused by control signals.

10. The phase interpolator circuit of claim 1 wherein the differential pairs of transistors receive current from inputs of the transimpedance amplifier circuit.

11. A phase shift circuit comprising:
    input buffer circuits that generate buffered signals in response to varying input signals;
    differential pairs of transistors that receive the buffered signals at control inputs;
    current source circuits, wherein each of the current source circuits is coupled to one of the differential pairs of transistors;
    a transimpedance amplifier circuit that converts current through the differential pairs of transistors into a voltage signal at an output, wherein the differential pairs of transistors are coupled to inputs of the transimpedance amplifier circuit, and wherein the output of the transimpedance amplifier circuit is a different node than a node of either of the inputs of the transimpedance amplifier circuit; and
    a voltage comparator that generates a periodic signal in response to the voltage signal generated by the transimpedance amplifier circuit, wherein an input of the voltage comparator is coupled to the output of the transimpedance amplifier circuit.

12. The phase shift circuit of claim 11 wherein each of the current source circuits is coupled to only one of the differential pairs of transistors.

13. The phase shift circuit of claim 11 wherein each of the input buffer circuits shifts input poles of the differential pairs of transistors to frequencies that are greater than frequencies of the buffered signals.

14. The phase shift circuit of claim 11 wherein each of the current source circuits generates the same current as each of the other current source circuits when the respective current source circuits are on.

15. The phase shift circuit of claim 11 wherein a first one of the current source circuits changes between on and off states to generate a phase shift in the voltage signal, and
wherein a number of the differential pairs of transistors coupled to the inputs of the transimpedance amplifier circuit that are on when the first one of the current source circuits is off equals a number of the differential pairs of transistors coupled to the inputs of the transimpedance amplifier circuit that are on when the first one of the current source circuits is on.

16. The phase shift circuit of claim 15 wherein a second one of the current source circuits changes between on and off states to generate a phase shift in the voltage signal, and
wherein a number of the differential pairs of transistors coupled to the inputs of the transimpedance amplifier circuit that are on when the second one of the current source circuits is off equals a number of the differential pairs of transistors coupled to the inputs of the transimpedance amplifier circuit that are on when the second one of the current source circuits is on.

17. The phase shift circuit of claim 11 wherein effective poles at the inputs of the transimpedance amplifier circuit remain constant in response to each change in the currents through the current source circuits caused by a change in a control signal.

18. The phase shift circuit of claim 11 wherein the transimpedance amplifier circuit comprises first and second transistors and first and second current mirror circuits, wherein the first transistor is a first cascode transistor coupled to a first input of the transimpedance amplifier circuit and to the first current mirror circuit, and the second transistor is a second cascode transistor coupled to a second input of the transimpedance amplifier circuit and to the second current mirror circuit.

19. A method comprising:
generating a current signal in response to varying signals using differential pairs of transistors in a phase interpolator circuit;
providing current through the differential pairs of transistors using current sources in the phase interpolator circuit;
converting the current signal into a voltage signal at an output of a transimpedance amplifier circuit in the phase interpolator circuit, wherein the differential pairs of transistors receive the current signal from inputs of the transimpedance amplifier circuit, and wherein the output of the transimpedance amplifier circuit is a different node than either of the inputs of the transimpedance amplifier circuit;
shifting a phase of the voltage signal in response to a change in current through at least one of the current sources caused by a control signal; and
generating a periodic signal using a voltage comparator in response to the voltage signal generated by the transimpedance amplifier circuit, wherein an input of the voltage comparator is coupled to the output of the transimpedance amplifier circuit.

20. The method of claim 19 wherein each of the current sources is coupled to only one of the differential pairs of transistors.

21. The method of claim 19 wherein a number of the differential pairs of transistors coupled to the inputs of the transimpedance amplifier circuit that are on when one of the current sources is off equals a number of the differential pairs of transistors coupled to the inputs of the transimpedance amplifier circuit that are on when that one of the current sources is on.

22. The method of claim 19 wherein effective poles at the inputs of the transimpedance amplifier circuit remain constant in response to each change in the currents through the current sources that is caused by a change in the control signal.

* * * * *